United States Patent [19]

Koshino et al.

[11] Patent Number: 4,479,830
[45] Date of Patent: Oct. 30, 1984

[54] METHOD OF MANUFACTURING A SEMICONDUCTOR DEVICE USING EPITAXIALLY REGROWN PROTRUSION AS AN ALIGNMENT MARKER

[75] Inventors: Yutaka Koshino, Yokosuka; Jiro Ohshima, Yokohama; Takashi Ajima, Kamakura; Toshio Yonezawa, Yokosuka, all of Japan

[73] Assignee: Tokyo Shibaura Denki Kabushiki Kaisha, Kawasaki, Japan

[21] Appl. No.: 462,201

[22] Filed: Jan. 31, 1983

[30] Foreign Application Priority Data

Feb. 1, 1982 [JP] Japan .................................. 57-14671

[51] Int. Cl.$^3$ .......................................... H01L 21/265
[52] U.S. Cl. ................... 148/1.5; 29/576 B; 29/576 T; 148/187; 357/91
[58] Field of Search ............... 148/1.5, 187; 29/576 B, 29/576 T; 357/91

[56] References Cited

U.S. PATENT DOCUMENTS

| | | | |
|---|---|---|---|
| 3,589,949 | 6/1971 | Nelson | 148/1.5 |
| 4,069,068 | 1/1978 | Beyer et al. | 148/1.5 |
| 4,133,704 | 1/1979 | McIver et al. | 148/1.5 |
| 4,144,100 | 3/1979 | McIver et al. | 148/1.5 |
| 4,216,030 | 8/1980 | Graul et al. | 148/1.5 |

OTHER PUBLICATIONS

Csepregi et al. Appl. Phys. Letts. 29 (1976) 645.
Seidel et al. Appl. Phys. Letts. 29 (1976) 648.
Bauer et al. Appl. Phys. Letts. 20 (1972) 107.
Crowder et al. in Ion Impl$^N$. in Semiconductors. Plenum, N.Y. 1973, p. 257.
Blood et al. J. Appl. Phys. 50 (1979) 173.

*Primary Examiner*—Upendra Roy
*Attorney, Agent, or Firm*—Finnegan, Henderson, Farabow, Garrett & Dunner

[57] ABSTRACT

A method for manufacturing a semiconductor device is shown which includes a step of ion implanting an impurity into an impurity-region formation region of a semiconductor substrate. Before or after the ion implantation step, silicon ions are implanted in a dose of $1 \times 10^{13}$ to $1 \times 10^{15}$/cm$^2$ into the impurity-region formation region and then the silicon ions so implanted are subjected to an activation treatment to form an epitaxial grown protrusion on the surface of the substrate. The protrusion is used as an alignment mark in the subsequent mask alignment step for photolithography.

5 Claims, 3 Drawing Figures

METHOD OF MANUFACTURING A SEMICONDUCTOR DEVICE USING EPITAXIALLY REGROWN PROTRUSION AS AN ALIGNMENT MARKER

BACKGROUND OF THE INVENTION

This invention relates to a method for manufacturing a semiconductor device and in particular a method for manufacturing a semiconductor device which includes an ion implantation step.

In the manufacture of a semiconductor device, a step of forming a desired impurity-region by ion implantation is adopted to obtain a high performance semiconductor device. This step is carried out by, for example, forming a buffer oxide film on a semiconductor substrate, coating a resist film on the oxide film, subjecting the resist film to patterning by photolithography to form a window corresponding to an impurity-region formation region and ion implanting a desired impurity into a resultant structure with the resist film pattern as a mask. In this method, the surface of the semiconductor substrate is even and flat after the removal of the resist film subsequent to the formation of the impurity-region. In any subsequent step, no mask alignment mark remains for the formation of a resist film pattern, etc. It is therefore conventionally necessary to provide a step for forming a mask alignment mark using one of the methods set out below.

(1) Before the step of forming a mask for ion implantation, a mask alignment mark which is necessary for photolithograhy in the subsequent step is formed on the surface of the buffer oxide film or the semiconductor substrate using another mask.

(2) After the formation of the resist film pattern as the mask for ion implantation, openings are formed with the resist film pattern as the mask in the oxide film underlying the resist film such that they reach the semiconductor substrate underlying the oxide film. The opening is used as an alignment mark in the subsequent step for photolithography.

According to method (1), the number of photolithography steps is increased, which results in a high manufacturing cost and an accuracy problem with respect to the configuration of the pattern.

In method (2), implanting an impurity through the opening directly into the semiconductor substrate is liable to produce a crystal defect. It is very difficult to control the depth of etching in the formation of the opening. Furthermore, a crystal defect is liable to be produced.

When the impurity-region is formed by the above-mentioned ion implantation method, the resultant semiconductor device has a high noise level.

SUMMARY OF THE INVENTION

It is accordingly the object of this invention to provide a method of manufacturing a semiconductor device in simpler manufacturing steps which results in a semiconductor device having an excellent element characteristic of a very low noise level.

According to this invention, there is provided a method for manufacturing a semiconductor device, comprising the steps of, implanting silicon ions in a dose of $1 \times 10^{13}$ to $1 \times 10^{15}/cm^2$ into impurity-region formation region of a semiconductor substrate and subjecting the implanted silicon ions to an activation treatment to form an epitaxially grown protrusion on the surface of the substrate before or after the ion implantation of an impurity into the impurity-region formation region of the semiconductor substrate.

According to the method of this invention, the manufacturing steps can be simplified and it is possible to obtain a semiconductor device having a sufficiently low noise level.

DETAILED DESCRIPTION OF THE PREFERRED EMBODIMENT

Figure 1:
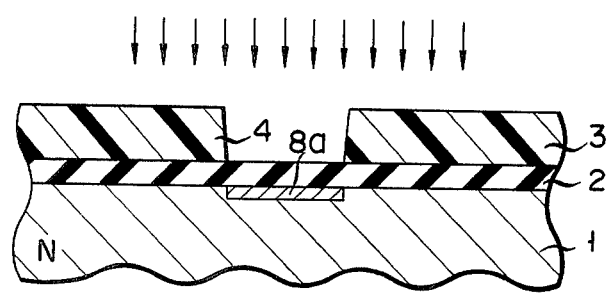
FIGS. 1 and 2 are cross sectional views showing the steps of manufacturing a bipolar transistor according to the method of this invention.
Figure 2:
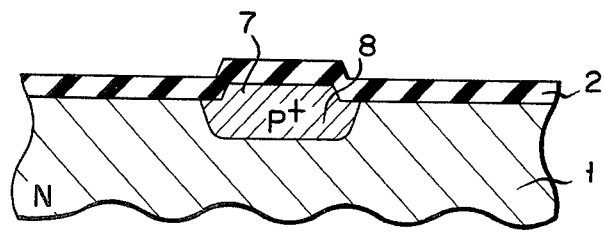

The method of this invention will be explained below as when applied to the manufacture of a bipolar transistor, by referring to FIGS. 1 and 2.

A buffer oxide film 2 with a thickness of, for example, 1,000 Å was formed on the surface of, for example, an n-type semiconductor substrate 1. A resist film 3 with a thickness of, for example, 1.5 μm was formed on the surface of the buffer oxide film 2. An opening 4 was formed by photolithography in the resist film 3 as shown in FIG. 1. Silicon ions were implanted in, for example, a dose of $1 \times 10^{14}/cm^2$ (silicon ions may be implanted in a dose of $1 \times 10^{13}$ to $1 \times 10^{15}$; preferably $1 \times 10^{14}$ to $5 \times 10^{14}/cm^2$), into a surface region 8a of the semiconductor substrate 1 with the resist film 3 as a mask. Similarly, and impurity, boron, was ion-implanted into the resultant semiconductor structure in a predetermined dose of $5 \times 10^{14}/cm^2$. After the semiconductor structure was heat treated at a temperature of 1,200° C., the implanted silicon ions were subjected to an activation treatment to form an epitaxial grown protrusion 7. At the same time, the boron implanted into the region 8a was activated by the heat treatment to form a p+-type region 8 corresponding to a base region of a bipolar transistor. The temperature of 1,000° to 1,200° C. is necessary to activate the silicon ions and impurity ions and diffuse the impurity ions. However, the temperature of 800° to 1,200° C. suffices in order to merely activate the silicon ions. Then, the resist film 3 was removed as shown in FIG. 2. An N+-type region, not shown, corresponding to an emitter region was formed by a known method using photolithography in the p+-type region 8, followed by forming electrodes interconnected with the respective active regions to provide an npn bipolar transistor.

Since the impurity-region 8 has the protrusion 7, a mask alignment can be successfully performed with the protrusion 7 as an alignment mark when photolithography is to be carried out subsequent to the formation of the impurity-region 8.

The resultant semiconductor device has a low noise level (In$\sqrt{h_{fe}}$, In: noise current of transistor; $h_{fe}$: current amplification factor) of 150 to 200 pA.

If the dose of silicon ions was less than $1 \times 10^{13} cm^2$, the formation of the protrusion was insufficient and it was not possible to sufficiently lower the noise level of the semiconductor device. If the dose of the silicon ions exceeded $1 \times 10^{15}/cm^2$, a number of crystal defects were produced in that region of the substrate where the silicon ions were implanted. As a result, the semiconductor device has a high noise level.

Figure 3:
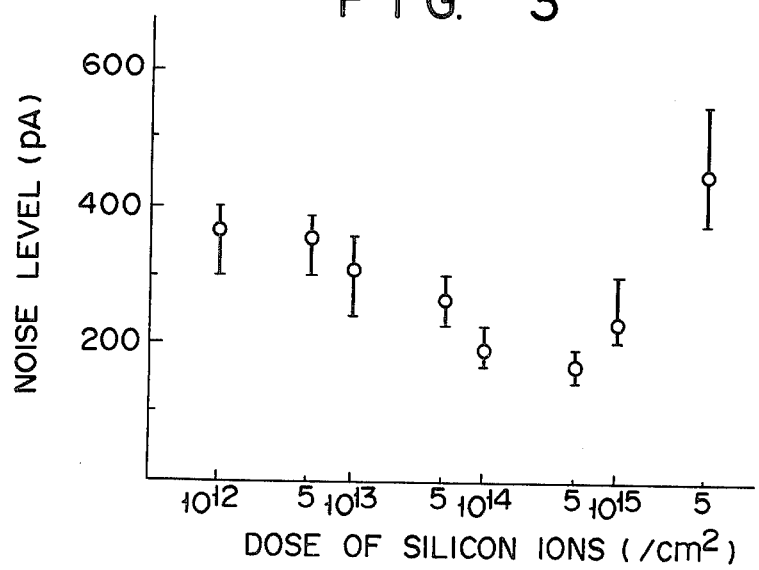
FIG. 3 shows the relation of a dose of silicon ions to the noise level of the bipolar transistor obtained according to the method of this invention.

An examination of the relation of the dose of silicon ions to the noise level of the semiconductor device provides the following results as shown in FIG. 3. From the graph of FIG. 3 it will be evident that the noise level of the semiconductor device can be decreased when the dose of silicon ions is $1 \times 10^{13}$ to $1 \times 10^{15}/cm^2$.

Measurement was made of the height of the protrusion 7 which was grown by the activation treatment in the dose range mentioned. It has been found that the height of the protrusion 7 was 400 to 500 Å.

In the above-mentioned example, the implantation of the silicon ions was carried out before the ion implantation of an impurity such as boron. The silicon ion-implantation also may be done after the ion implantation of the impurity.

The reason why a semiconductor device with a very low noise level is obtained by the implantation of the silicon ions into the impurity-region formation region and their activation treatment has not sufficiently been clarified.

It is probably due to the fact that the impurity atoms in the impurity-region are ideally rearranged owing to the crystallization of the silicon by the activation treatment, that is, the impurity atoms are uniformly rearranged among the silicon crystals without segregation.

According to the method of this invention, it is possible to readily obtain an excellent element characteristic of a very low noise level. Since according to the method of this invention mask alignment can readily be carried out with the protrusion formed by the activation treatment of the implanted silicon ions as an alignment mark in the subsequent step for photolithography, it is not necessary to form a pattern for mask alignment and thus the manufacturing step can be simplified.

What we claim is:

1. In a method of manufacturing a semiconductor device which includes a step for ion-implanting an impurity into an impurity-region formation region of a silicon substrate, the method comprising:
    (1) ion-implanting silicon ions in a dose of $1 \times 10^{13}$ to $1 \times 10^{15}/cm^2$ into the impurity-region formation region immediately before or immediately after said ion implantation step,
    (2) subjecting the implanted silicon ions to an activation treatment to form an epitaxially grown protrusion on the surface of the substrate, and
    (3) using said protrusion as an alignment mark.

2. A method according to claim 1, in which said dose of silicon ions is $1 \times 10^{14}$ to $5 \times 10^{14}$.

3. A method according to claim 1, in which said ion implanted impurity is activated by said activation treatment.

4. A method according to claim 1, in which said protrusion is used as an alignment mark in the subsequent mask alignment step.

5. A method according to claim 1, in which said activation treatment is a heat treatment at a temperature range of 800° to 1,200° C.

* * * * *